US005683850A

United States Patent [19]

Matushita et al.

[11] Patent Number: 5,683,850

[45] Date of Patent: Nov. 4, 1997

[54] DIAZO HEAT-SENSITIVE RECORDING MATERIAL COMPRISING HYDROXY COUMARIN AS A COUPLER

[75] Inventors: Tetunori Matushita; Hiroshi Sato; Sadao Ishige; Kimiatsu Nomura; Mitsuyuki Tsurumi, all of Shizuoka, Japan

[73] Assignee: Fuji Photo Film Co., Ltd., Kanagawa, Japan

[21] Appl. No.: 753,886

[22] Filed: Dec. 2, 1996

[30] Foreign Application Priority Data

Dec. 5, 1995 [JP] Japan .................................... 7-316280

[51] Int. Cl.$^{6}$ .............................. G03C 1/54; G03C 1/58; G03F 7/021

[52] U.S. Cl. .......................... 430/138; 430/156; 430/157; 430/171; 430/172; 430/173; 430/182; 430/183; 430/186

[58] Field of Search .................................... 430/138, 156, 430/157, 171, 172, 173, 182, 183, 186

[56] References Cited

U.S. PATENT DOCUMENTS

| | | | |
|---|---|---|---|
| 4,400,458 | 8/1983 | Walkow et al. | 430/171 |
| 4,650,740 | 3/1987 | Usami et al. | 430/171 |
| 4,895,826 | 1/1990 | Watanabe et al. | 430/138 |
| 5,213,939 | 5/1993 | Sugiyama et al. | 430/183 |
| 5,296,329 | 3/1994 | Sugiyama et al. | 430/182 |
| 5,338,642 | 8/1994 | Tanaka et al. | 430/182 |

*Primary Examiner*—John S. Chu

*Attorney, Agent, or Firm*—Sughrue, Mion, Zinn, Macpeak & Seas, PLLC

[57] ABSTRACT

A diazo heat-sensitive recording material having excellent raw stock storability and image storage characteristics, which comprises a support having thereon a recording layer comprising a diazo compound, a coupling component and an organic base. The diazo compound is a 4-disubstituted amino-2-alkoxybenzenediazonium salt and the coupling component is a compound represented by the following general formula:

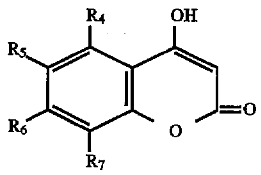

wherein $R_4$, $R_5$, $R_6$ and $R_7$ each represents a hydrogen atom, an alkyl group, an aryl group, an aralkyl group, an alkyloxy group, an aryloxy group, an alkylthio group, an arylthio group, an acyl group, an alkoxycarbonyl group, an acyloxy group, a carbamoyl group, a sulfamoyl group, a halogen atom, a cyano group or a nitro group.

13 Claims, No Drawings

DIAZO HEAT-SENSITIVE RECORDING MATERIAL COMPRISING HYDROXY COUMARIN AS A COUPLER

FIELD OF THE INVENTION

The present invention relates to heat-sensitive recording materials comprising specific combinations of diazo compounds and couplers as color developing components, and particularly to red color development type diazo heat-sensitive recording materials having excellent raw stock storability prior to recording and excellent image storage characteristics (light fastness) after recording.

BACKGROUND OF THE INVENTION

Diazo compounds have very high chemical activity, and react with compounds called couplers such as phenol derivatives or compounds having active methylene groups to readily form azo dyes. They also are photosensitive, and are decomposed by light irradiation to thereby lose their activity.

The diazo compounds have therefore been conventionally utilized in light recording materials to make diazo copies, as described, for example, in *Shashin Kohgaku no Kiso—Higinen Shashin* (The Fundamentals of Photographic Engineering—Nonsilver Photograph), pages 89 to 117 and 182 to 201 (1982), Corona Publishing Co. Ltd.).

Furthermore, by utilizing the property of light decomposition and resulting loss of activity, diazo compounds have recently been applied also to recording materials requiring fixed images. Typical examples of such a recording material include light-fixing type heat-sensitive recording materials in which diazo compounds and couplers are heated according to an image signal and allowed to react with one another to form images, followed by light irradiation to fix the images, as proposed by Koji Sato et al., *Gazo Denshi Gakkaishi,* 11(4), 290–296 (1982), etc.

However, such recording materials use diazo compounds as color forming elements which are highly active. As a result, the diazo compounds gradually pyrolyze even in the dark to thereby lose the reactivity. Therefore, these recording materials disadvantageously have a short shelf life.

Various methods have been proposed as means for improving the above-described instability of diazo compounds, and one of the most effective means includes a method of incorporating the diazo compound into microcapsules.

Such micro-encapsulation of the diazo compound isolates the diazonium salt from decomposition enhancers such as water and a base. As a result, decomposition of the diazo compound is considerably inhibited, and the shelf life of a recording material employing the encapsulated diazo compound is also markedly improved, as described in Tomomasa Usami et al., *Denshi Shashin Gakkaishi,* 26(2), 115–125 (1987).

In a general method of encapsulating the diazo compound, a diazonium salt is dissolved in a hydrophobic solvent (oily phase). The resulting solution is added to an aqueous solution of a water-soluble polymer (aqueous phase), followed by emulsification and dispersion with a homogenizer or the like. In the meantime, a monomer or a prepolymer forming the walls of the microcapsule is added to either the oily phase or the aqueous phase, or both, thereby inducing a polymerization reaction or depositing a polymer at the interface of the oily phase and the aqueous phase to form polymer walls for the microcapsules.

These methods are described in detail, for example, in Tomohito Kondo, *Microcapsules,* Nikkan Kogyo Shinbunsha (1970), and Tamotsu Kondo et al., *Microcapsules,* Sankyo Shuppan (1977), etc.

The walls of microcapsules can be formed from various materials such as crosslinked gelatin, alginates, cellulose derivatives, urea resins, urethane resins, melamine resins and nylon resins.

When the microcapsule walls are formed of a material having a glass transition temperature which is a little higher than room temperature such as a urea resin and a urethane resin, the capsule walls are impermeable to substrate at room temperature, whereas they become permeable at the glass transition temperature or higher. Such microcapsules are therefore called thermally responsive microcapsules, and are useful for preparing heat-sensitive recording materials.

That is, the preparation of recording materials in which a heat-sensitive recording layer comprising diazonium salt-containing thermally responsive microcapsules, couplers and bases is formed on a support provides for stable retention of the diazonium salt over a long period of time, easy formation of color-developed images by heating and also image fixation by light irradiation.

As described above, micro-encapsulation makes it possible to markedly improve the stability of the diazo compounds.

On the other hand, 4-substituted amino-2-alkoxybenzenediazonium salts are known to exhibit particularly excellent performance as color forming materials for thermal recording (JP-A-4-59288 (the term "JP-A" as used herein means an "unexamined published Japanese patent application)), and to form red dyes having very good hues when subjected to a coupling reaction with barbituric acid derivatives (JP-A-4-197782).

However, recording materials containing the above-described 4-substituted amino-2-alkoxybenzenediazonium salts have inadequate raw stock storability (background coloring properties during storage and before recording) and insufficient image storage characteristics (light fastness) of developed color images.

SUMMARY OF THE INVENTION

The present inventors have conducted extensive investigations to solve the above-described problems of the prior art. As a result, the present inventors have discovered that the use of diazo compounds having specific substituent groups in combination with 4-hydroxycoumarin derivatives as a coupling component provides a very good result, to thereby achieve the present invention.

Accordingly, an object of the present invention is to provide a heat-sensitive recording material having excellent raw stock storability and image storage characteristics using a 4-substituted amino-2-alkoxybenzenediazonium salt.

The above-objectives of the present invention are attained by a diazo heat-sensitive recording material comprising a support having thereon a recording layer comprising a diazo compound, a coupling component and an organic base, wherein said diazo compound is a diazonium salt represented by the following general formula (I) and said coupling component is a compound represented by the following general formula (II):

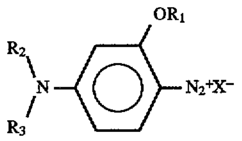

(I)

wherein $R_1$, $R_2$ and $R_3$ each represents an alkyl group, an aralkyl group or an aryl group; $R_2$ and $R_3$ may form a ring together with the nitrogen atom in formula (I) adjacent to $R_2$ and $R_3$; and X represents an acid anion,

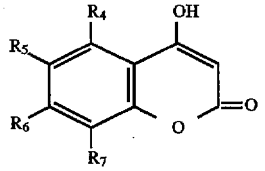

(II)

wherein $R_4$, $R_5$, $R_6$ and $R_7$, which may be the same or different, each represents a hydrogen atom, an alkyl group, an aryl group, an aralkyl group, an alkyloxy group, an aryloxy group, an alkylthio group, an arylthio group, an acyl group, an alkoxycarbonyl group, an acyloxy group, a carbamoyl group, a sulfamoyl group, a halogen atom, a cyano group or a nitro group; and at least one pair of $R_4$ and $R_5$, $R_5$ and $R_6$, and $R_6$ and $R_7$ may be combined with each other to form a ring.

DETAILED DESCRIPTION OF THE INVENTION

In general formula (I), the group represented by $R_1$, $R_2$ or $R_3$ is preferably an alkyl group having 1 to 18 carbon atoms, an aralkyl group having 7 to 21 carbon atoms or an aryl group having 6 to 20 carbon atoms, which alkyl, aralkyl or aryl group may further have a substituent group.

In general formula (I) when $R_1$, $R_2$ and $R_3$ are substituted, examples of useful substituent groups include alkyl, aryl, alkyloxy, aryloxy, alkylthio, arylthio, acyl, alkoxycarbonyl, acyloxy, carbamoyl, alkylsulfonyl, arylsulfonyl, sulfamoyl, acylamino and cyano groups and halogen atoms.

The ring which is optionally formed by $R_2$ and $R_3$ together with the nitrogen atom in formula (I) may be a 5- or 6-membered ring and may further contain a hetero atom in addition to the nitrogen atom in formula (I). Examples thereof include morpholino, piperidino, etc.

In general formula (I), the total number of carbon atoms in $R_1$, $R_2$ and $R_3$ is preferably 12 or more, and particularly preferably 14 or more to provide for oil solubility.

In general formula (I), specific examples of acids of the acid anions represented by X include polyfluoroalkylcarboxylic acids each having 1 to 9 carbon atoms, polyfluoroalkylsulfonic acids each having 1 to 9 carbon atoms, boron tetrafluoride, tetraphenylboron, hexafluorophosphoric acid, aromatic carboxylic acids and aromatic sulfonic acids. Furthermore, complex compounds can be formed using zinc chloride, cadmium chloride, tin chloride or the like to stabilize the diazonium salts.

Particularly preferred examples of the compounds represented by general formula (I) include compounds represented by general formula (III):

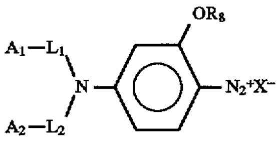

(III)

wherein $R_8$ represents an alkyl group, an aralkyl group or an aryl group; $L_1$ and $L_2$ each represents an alkylene group; $A_1$ and $A_2$ each represents an alkyl group, an aralkyl group, an aryl group, an alkyloxy group, an aryloxy group, an alkylthio group, an arylthio group, an acyl group, an alkoxycarbonyl group, an acyloxy group, a carbamoyl group, an alkylsulfonyl group, an arylsulfonyl group, a sulfamoyl group, a halogen atom or a cyano group; $L_1$ and $L_2$, and $A_1$ and $A_2$ may each be the same or different; and X represents an acid anion.

Preferred examples of the compounds represented by general formula (III) include compounds in which at least one of $A_1$ and $A_2$ is an alkoxycarbonyl group, a carbamoyl group, a sulfamoyl group or a cyano group.

In general formula (II), $R_4$, $R_5$, $R_6$ and $R_7$ each is preferably a hydrogen atom, an unsubstituted or substituted alkyl group having 4 to 36 carbon atoms, an unsubstituted or substituted aryl group having 6 to 20 carbon atoms, an unsubstituted or substituted aralkyl group having 7 to 21 carbon atoms, an unsubstituted or substituted alkyloxy group having 4 to 36 carbon atoms, an unsubstituted or substituted aryloxy group having 6 to 20 carbon atoms, an unsubstituted or substituted alkylthio group having 4 to 36 carbon atoms, an unsubstituted or substituted arylthio group having 6 to 20 carbon atoms, an unsubstituted or substituted alkoxycarbonyl group having 2 to 25 carbon atoms, an unsubstituted or substituted acyloxy group having 6 to 20 carbon atoms, an unsubstituted or substituted carbamoyl group having 2 to 37 carbon atoms, an unsubstituted or substituted sulfamoyl group having 2 to 35 carbon atoms, and a halogen atom.

When these groups are substituted, examples of useful substituent groups include alkyl, aryl, aralkyl, alkyloxy, aryloxy, alkylthio, arylthio, acyl, alkoxycarbonyl, acyloxy, carbamoyl, sulfamoyl and acylamino groups and halogen atoms.

Preferred examples of the above-described substituent groups for $R_4$, $R_5$, $R_6$ and $R_7$ include alkyl groups each having 1 to 36 carbon atoms, aryl groups each having 6 to 20 carbon atoms, aralkyl groups each having 7 to 21 carbon atoms, alkyloxy groups each having 1 to 36 carbon atoms, aryloxy groups each having 6 to 20 carbon atoms, alkylthio groups each having 1 to 36 carbon atoms, arylthio groups each having 6 to 20 carbon atoms, alkylcarbonyl groups each having 2 to 25 carbon atoms, arylcarbonyl groups each having 7 to 35 carbon atoms, alkoxycarbonyl groups each having 2 to 25 carbon atoms, acyloxy groups each having 2 to 20 carbon atoms, carbamoyl groups each having 2 to 37 carbon atoms, acylamino groups each having 2 to 35 carbon atoms, halogen atoms, and a cyano group.

In general formula (II), the total number of carbon atoms in $R_4$, $R_5$, $R_6$ and $R_7$ is preferably 12 or more, and particularly preferably 14 or more to provide for oil solubility.

The ring which is optionally formed by a pair of $R_4$ and $R_5$, $R_5$ and $R_6$, or $R_6$ and $R_7$ may be a 5- or 6-membered, aromatic or nonaromatic ring, and may contain a hetero atom.

Preferred examples of the compounds represented by general formula (II) include compounds represented by general formula (IV):

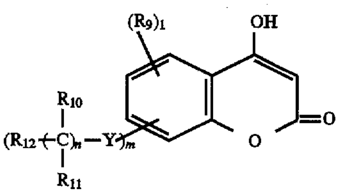

(IV)

wherein $R_9$ represents a hydrogen atom, an alkyl group, an aryl group, an aralkyl group, an acyl group, an alkoxycarbonyl group, an acyloxy group, a carbamoyl group, a sulfamoyl group or a halogen atom; $R_{10}$, $R_{11}$ and $R_{12}$ each represents a hydrogen atom, an alkyl group, an aryl group, an aralkyl group, an alkyloxy group, an aryloxy group, an alkylthio group, an arylthio group, an acyl group, an alkoxycarbonyl group, an acyloxy group, a carbamoyl group or a sulfamoyl group; Y represents an oxygen atom or a sulfur atom; l+m is an integer of 1 to 4 with the proviso that m is an integer of 1 or more; and n represents an integer of 1 to 10.

$R_9$ is preferably a hydrogen atom, an unsubstituted or substituted alkyl group having 4 to 36 carbon atoms, an unsubstituted or substituted aryl group having 6 to 20 carbon atoms or a halogen atom.

$R_{10}$, $R_{11}$ and $R_{12}$ each is preferably a hydrogen atom, an unsubstituted or substituted alkyl group having 1 to 24 carbon atoms, an unsubstituted or substituted aryl group having 6 to 20 carbon atoms, an unsubstituted or substituted aralkyl group having 7 to 21 carbon atoms, an unsubstituted or substituted alkyloxy group having 4 to 36 carbon atoms, an unsubstituted or substituted aryloxy group having 6 to 20 carbon atoms, an unsubstituted or substituted alkylthio group having 4 to 36 carbon atoms, an unsubstituted or substituted arylthio group having 6 to 20 carbon atoms, an unsubstituted or substituted alkoxycarbonyl group having 2 to 25 carbon atoms, an unsubstituted or substituted acyloxy group having 2 to 20 carbon atoms, an unsubstituted or substituted carbamoyl group having 2 to 37 carbon atoms, or an unsubstituted or substituted sulfamoyl group having 2 to 35 carbon atoms.

Y is preferably an oxygen atom.

The diazo compound for use in the present invention preferably has a melting point of 30° to 200° C., and those having a melting point of 50° to 150° C. are particularly preferred in terms of handling.

In the present invention, in order to improve the raw stock storability of the heat-sensitive recording materials before use, the diazo compound is preferably encapsulated as described below. In that case, the diazo compound is dissolved in an appropriate solvent for micro-encapsulation. Therefore, the diazo compound preferably has an appropriate solubility in the solvent and a low solubility in water. Specifically, the diazo compound preferably has a solubility in organic solvents of 5% or more and a solubility in water of 1% or less.

In the present invention, the heat-sensitive recording layer preferably contains the diazo compound in an amount ranging from 0.02 $g/m^2$ to 3 $g/m^2$, and in terms of color forming density the preferred amount ranges from 0.1 $g/m^2$ to 2 $g/m^2$.

Specific examples of the diazo compounds of the present invention are shown below, but the present invention should not be construed as being limited thereto.

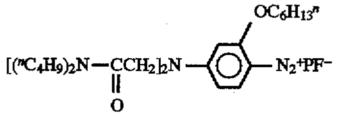

(A-1)

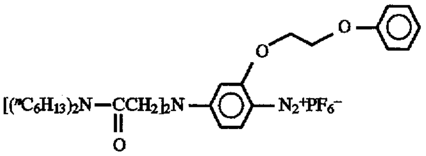

(A-2)

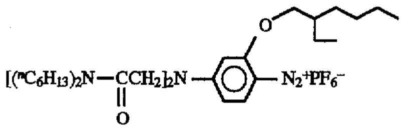

(A-3)

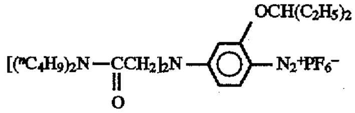

(A-4)

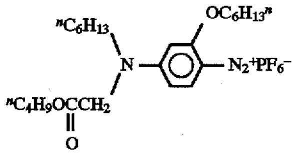

(A-5)

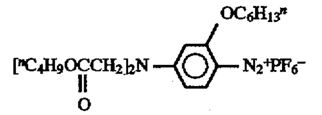

(A-6)

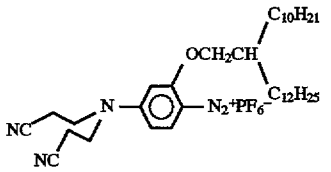

(A-7)

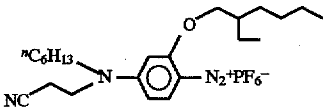

(A-8)

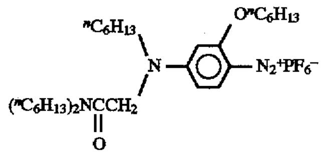

(A-9)

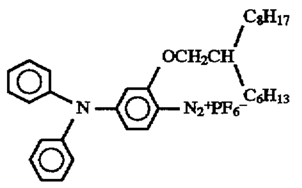

(A-10)

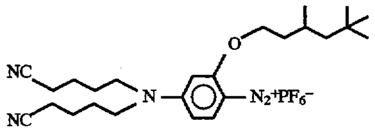

(A-11)

-continued

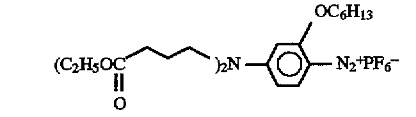

(A-12)

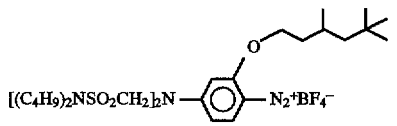

(A-13)

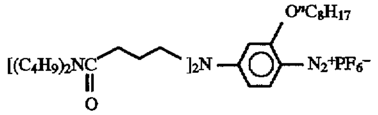

(A-14)

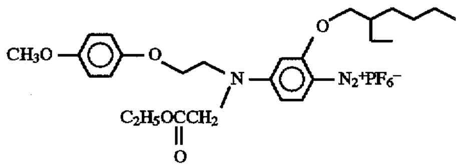

(A-15)

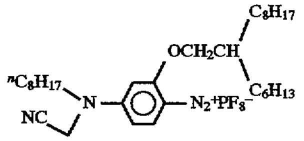

(A-16)

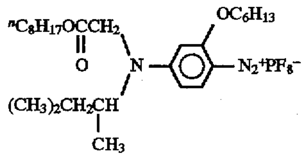

(A-17)

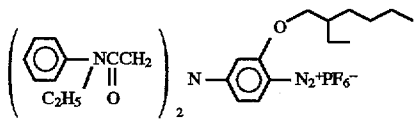

(A-18)

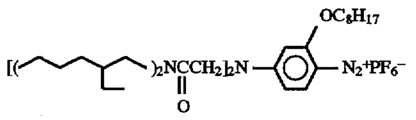

(A-19)

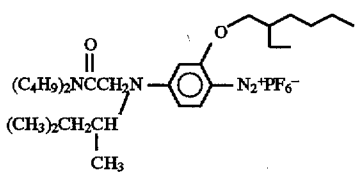

(A-20)

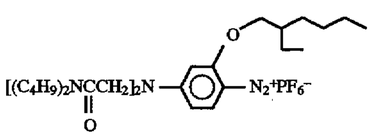

(A-21)

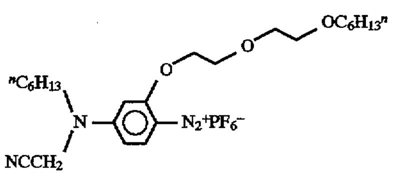

(A-22)

-continued

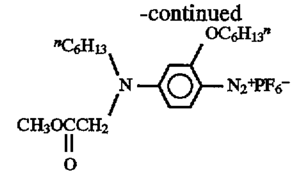

(A-23)

The diazo compound represented by general formula (I) may be used either alone or in a combination of two or more thereof. Furthermore, the diazo compound represented by general formula (I) can be used in combination with known diazo compounds depending on the intended application such as hue adjustment. However, the diazonium salt represented by general formula (I) preferably account for 50% by weight or more of all diazo compounds used. Preferred examples of the diazo compounds which can be used in combination with the diazo compound of formula (I) include 4-diazo-1-dimethylamino-benzene,
4-diazo-2-butoxy-5-chloro-1-dimethylaminobenzene,
4-diazo-1-methylbenzylaminobenzene,
4-diazo-1-ethylhydroxy-ethylaminobenzene,
4-diazo-1-diethylamino-3-methoxybenzene,
4-diazo-1-morpholinobenzene,
4-diazo-1-morpholino-2,5-dibutoxybenzene,
4-diazo-1-tolylmercapto-2,5-diethoxy-benzene,
4-diazo-1-piperazino-2-methoxy-5-chlorobenzene,
4-diazo-1-(N,N-dioctylaminocarbonyl)benzene,
4-diazo-1-(4-tert-octylphenoxy)benzene,
4-diazo-1-(2-ethylhexanoyl-piperidino)-2,5-dibutoxybenzene,
4-diazo-1-[α-(2,4-di-tert-amylphenoxy)butylpiperidino]benzene, 4-diazo-1-(4-methoxy)phenylthio-2,5-diethoxybenzene,
4-diazo-1-(4-methoxy)benzamido-2,5-diethoxybenzene and
4-diazo-1-pyrrolidino-2-methoxybenzene.

Specific examples of the coupling components of the present invention are shown below, however, the present invention should not be construed as being limited thereto.

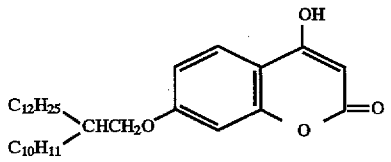

(B-1)

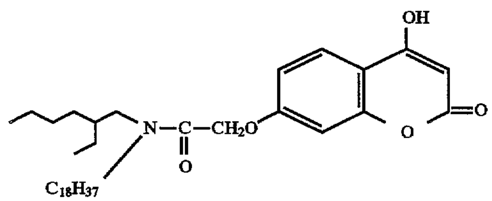

(B-2)

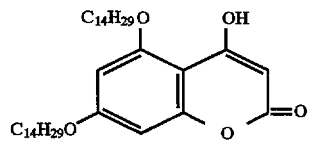

(B-3)

-continued
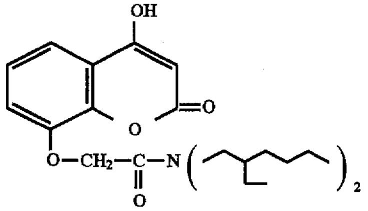
(B-4)
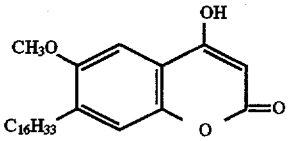
(B-5)
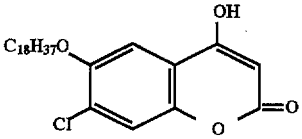
(B-6)
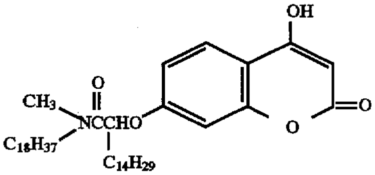
(B-7)
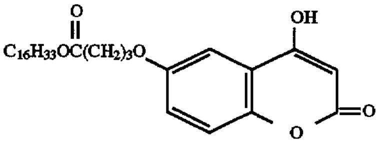
(B-8)
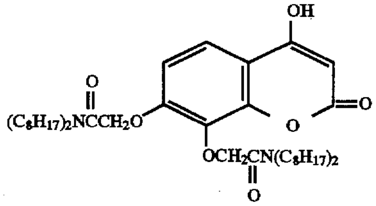
(B-9)
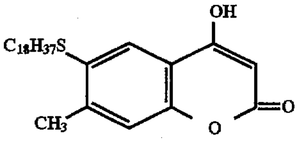
(B-10)
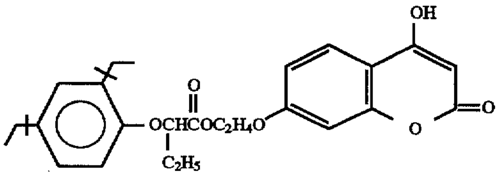
(B-11)
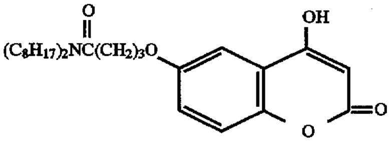
(B-12)
-continued
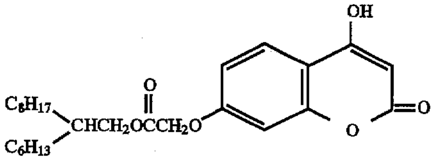
(B-13)
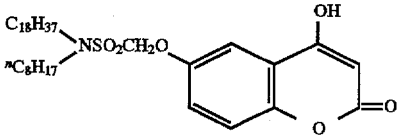
(B-14)
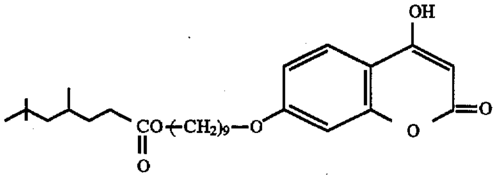
(B-15)
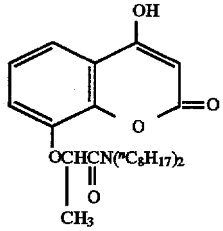
(B-16)
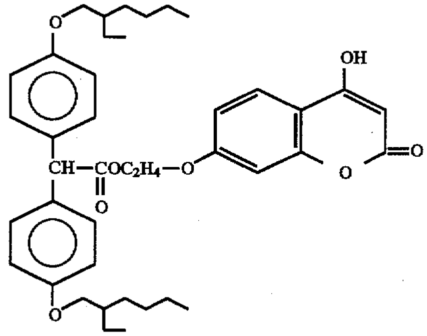
(B-17)
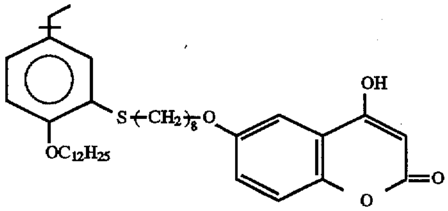
(B-18)
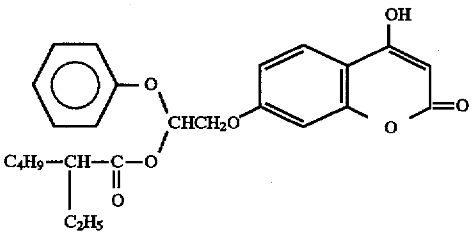
(B-19)

-continued (B-20)

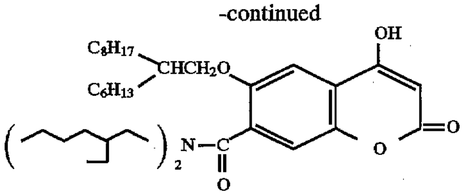

(B-21)

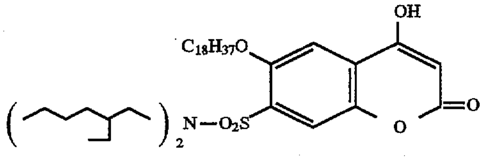

(B-22)

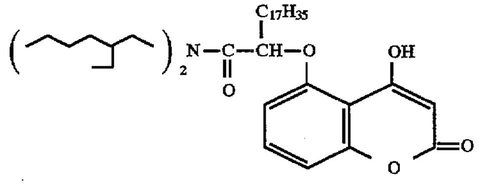

(B-23)

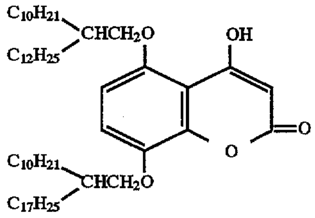

(B-24)

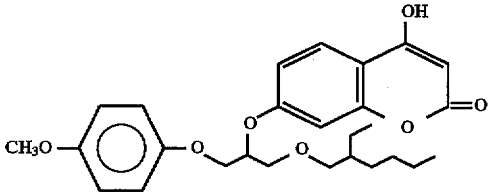

In the present invention, known coupling components which are coupled with diazo compounds in a basic system to form dyes can also be used in combination with the coupling component represented by general formula (II) for adjusting the hue as needed. However, the coupling component represented by general formula (II) is preferably used in an amount of 50% by weight or more based on all the coupling components used.

Details of the preparation of the diazonium salts represented by general formula (I) and the coupling compounds represented by general formula (II) are described, for example, in Photographic Science and Engineering 18, 123 (1974) and U.S. Pat. No. 3,463,639.

Examples of known coupling components which can be used in combination with the coupling component represented by general formula (II) include active methylene compounds having a methylene group adjacent to a carbonyl group, phenol derivatives and naphthol derivatives, and specific examples thereof include resorcin, phloroglucin, sodium 2,3-dihydroxynaphthalene-6-sulfonate, 1-hydroxy-2-naphthoic acid morpholinopropylamide, 1,5-dihydroxynaphthalene, 2,3-dihydroxynaphthalene, 2,3-dihydroxy-6-sulfonaphthalene, 2-hydroxy-3-naphthoic acid morpholinopropylamide, 2-hydroxy-3-naphthoic acid octylamide, 2-hydroxy-3-naphthoic acid anilide, benzoylacetanilide, 1-phenyl-3-methyl-5-pyrazolone, 1-(2,4,6-trichlorophenyl)-3-anilino-5-pyrazolone, 2-{3-[α-(2,4-di-ter-amylphenoxy)butaneamido]benzamido}phenol, 2,4-bis(benzoylacetamino)toluene and 1,3-bis(pivaloylacetamino-methyl)benzene.

In the heat-sensitive recording materials of the present invention, the diazo compound is preferably encapsulated in order to improve raw stock storability prior to use.

The microcapsules can be prepared by dissolving the diazonium salt and compounds of the same or different kinds which react each other to form a polymer substance in a nonaqueous solvent having a boiling point of 40° to 95° C. at ordinary pressure, emulsifying and dispersing the resulting solution in a hydrophilic protective colloidal solution, then transferring a wall forming substance to the surfaces of the oil droplets while removing the solvent by distillation (e.g., by reducing the pressure of the reaction vessel and elevating the temperature of the system), and allowing polymer formation to proceed by polyaddition or polycondensation at the surfaces of the oil droplets to form wall films.

In the present invention, the use of substantially solvent-free microcapsules as described below is preferred as providing good shelf life. Furthermore, the polymer substance forming the walls of the microcapsules is preferably at least one selected from polyurethane and polyurea.

Methods for producing microcapsules (with polyurea or polyurethane walls) containing a diazonium salt for use in the present invention are described below.

First, a diazonium salt is dissolved in a hydrophobic organic solvent which forms the cores of the capsules. The organic solvent used in this case is preferably at least one selected from hydrocarbon halides, carboxylates, phosphates, ketones and ethers. A polyvalent isocyanate as a wall material may additionally be added to the core solvent (oily phase).

On the other hand, for an aqueous phase, a water-soluble polymer such as polyvinyl alcohol or gelatin is dissolved in water to prepare an aqueous solution. Then, the above-described oily phase is poured thereinto, followed by emulsifying and dispersing with emulsification means such as a homogenizer. At this time, the water-soluble polymer acts as a stabilizer for emulsification and dispersion. In order to more stably conduct emulsification and dispersion, a surfactant may be added to at least one of the oily phase and the aqueous phase.

The amount of the polyvalent isocyanate is selected so that the microcapsules have a mean particle size of 0.3 μm to 12 μm and a wall thickness of 0.01 μm to 0.3 μm. The size of the dispersed particles is generally about 0.2 μm to about 10 μm. In the emulsified dispersion, the polymerization reaction of the polyvalent isocyanate takes place at the interface of the oily phase and the aqueous phase to form a polyurea wall.

If a polyol has previously been added to the aqueous phase, the polyvalent isocyanate can react with the polyol to form a polyurethane wall. In order to enhance the reaction rate, it is preferable to keep the reaction temperature high or to add an appropriate polymerization catalyst. The polyvalent isocyanates, the polyols, the reaction catalysts and polyamines for forming parts of the walls are described in detail in *Polyurethane Handbook*, edited by Keiji Iwata, Nikkan Kogyo Shinbunsha (1987).

The hydrophobic organic solvent in which the above-described diazonium salt compound is dissolved to form the core of the microcapsules is preferably an organic solvent having a boiling point of 100° to 300° C. Specific examples thereof include alkylnaphthalenes, alkyldiphenylethanes, alkyldiphenylmethanes, alkylbiphenyls, chlorinated paraffin, tricresyl phosphate, maleates, adipates, sulfates and sulfonates. They may be used as a mixture of two or more in combination.

When the solubility of the diazonium salt to be encapsulated in these solvents is poor, a low boiling solvent in which the diazonium salt is highly soluble can be used in combination therewith. Specific examples thereof include ethyl acetate, butyl acetate, methylene chloride, tetrahydrofurane and acetone. When only the low boiling solvent is used to form the cores of the microcapsules, the solvent evaporates during the encapsulation reaction to form coreless capsules in which the walls of the capsules and the diazo compound are integrally present.

The polyvalent isocyanate used as a raw material for the walls of the microcapsules is preferably a compound having a trifunctional or higher-functional isocyanate group. However, a difunctional isocyanate compound may be used in combination therewith. Specific examples thereof include dimers or trimers (burettes or isocyanurates) of diisocyanates such as xylene diisocyanate, hydrogenated xylene diisocyanate, hexamethylene diisocyanate, tolylene diisocyanate, hydrogenated tolylene diisocyanate, and isophorone diisocyanate, as main raw materials, multifunctional adducts of these diisocyanates with polyols such as trimethylolpropane, and condensates of benzene isocyanate with formalin.

Furthermore, the polyol or the polyamine, which is added beforehand to the hydrophobic solvent forming the cores or to the water-soluble polymer solution acting as a dispersing medium, can also be used as one of the raw materials for the walls of the microcapsules. Specific examples of the polyols and the polyamines include propylene glycol, glycerin, trimethylolpropane, triethanolamine, sorbitol and hexamethylenediamine. When the polyol is added, a polyurethane wall is formed.

The water-soluble polymer used in the water-soluble polymer solution thus prepared in which the oily phase of the capsules is dispersed is preferably a compound having a solubility in water of 5 g/l or more at a temperature at which the oily phase is to be emulsified. Specific examples thereof include polyvinyl alcohol and modified products thereof, polyacrylic acid amide and derivatives thereof, ethylene-vinyl acetate copolymers, styrene-maleic anhydride copolymers, ethylene-maleic anhydride copolymers, isobutylene-maleic anhydride copolymers, polyvinylpyrrolidone, ethylene-acrylic acid copolymers, vinyl acetateacrylic acid copolymers, carboxymethyl cellulose, methyl cellulose, casein, gelatin, starch derivatives, gum arabic and sodium alginate.

These water-soluble polymers preferably have little or no reactivity with isocyanate compounds. For example, those having reactive amino groups in their molecular chains such as gelatin must be modified beforehand to remove this functional group.

Furthermore, when surfactants are added, the addition amount of the surfactant is preferably 0.1% to 5% based on the weight of the oily phase, and more preferably 0.5% to 2%.

The emulsification can be conducted by use of a known emulsifying device such as a homogenizer, a Manton gaulin, an ultrasonic dispersing device or a Kady mill. After emulsification, the emulsified products are heated to 30° to 70° C. to enhance the capsule wall formation reaction. Furthermore, in order to prevent coagulation of the capsules, the collision probability of the capsules is preferably reduced by adding water, or by adequately stirring during the reaction.

Dispersing agents for preventing coagulation may be newly added during the reaction. Generation of carbonic acid gas is observed with progress of the polymerization reaction, and the termination thereof can be considered to be the approximate end of the capsule wall formation reaction. Usually, a reaction time of several hours provides the desired diazonium salt-containing microcapsules.

In the present invention, organic bases are added to enhance the coupling reaction of the diazo compounds and the couplers. These organic bases can be used alone or in a combination of two or more thereof. The basic materials include nitrogen-containing compounds such as tertiary amines, piperidine derivatives, piperazine derivatives, amidines, formamidines, pyridine derivatives, guanidine derivatives and morpholine derivatives.

Of these, particularly preferred are piperazine derivatives such as

N,N'-bis(3-phenoxy-2-hydroxypropyl)-piperazine,
N,N'-bis[3-(p-methylphenoxy)-2-hydroxypropyl]-piperazine,
N,N'-bis[3-(p-methoxyphenoxy)-2-hydroxypropyl]-piperazine,
N,N'-bis(3-phenylthio-2-hydroxypropyl)piperazine,
N,N'-bis[3-(β-naphthoxy)-2-hydroxypropyl]piperazine,
N-3-(β-naphthoxy)-2-hydroxypropyl-N'-methylpiperazine and
1,4-bis{[3-(N-methylpiperazino)-2-hydroxy]propyloxy}benzene;

morpholine derivatives such as

N-[3-(β-naphthoxy)-2-hydroxy]-propylmorpholine,
1,4-bis[(3-morpholino-2-hydroxy)propyloxy]-benzene and
1,3-bis[(3-morpholino-2-hydroxy)propyloxy]-benzene;

piperizine derivatives such as

N-(3-phenoxy-2-hydroxypropyl)piperizine and
N-dodecylpiperizine; and guanidine derivatives such as triphenylguanidine, tricyclo-hexylguanidine and dicyclohexylphenylguanidine.

In the present invention, the coupling component and the basic material preferably are each used in an amount of 0.1 to 30 parts by weight per one part by weight of the diazo compound.

In the present invention, color forming auxiliaries can be added to enhance the color forming reaction, in addition to the above-described organic bases.

The color forming auxiliaries are substances which increase the developed color density in thermal recording or lower the minimum color forming temperature. Also, color forming auxiliaries produce conditions under which the diazo compound, the basic material, the coupler, etc. readily react by lowering the melting point thereof or the softening point of the capsule walls.

The color forming auxiliaries of the present invention can be added to a heat-sensitive recording layer, for example, so as to conduct heat development rapidly and safely at low energy. The color forming auxiliaries include phenol derivatives, naphthol derivatives, alkoxy-substituted benzene derivatives, alkoxy-substituted naphthalene derivatives, hydroxy compounds, amide compounds and sulfonamide compounds. These compounds are considered to lower the melting point of the coupling component or the basic material, or to improve the heat permeability of the capsule wall. This makes it possible to realize high developed color density.

The color forming auxiliaries for use in the present invention also include thermally fusible substances. The thermally fusible substances are substances having a melting point of 50° to 150° C. which are solid at ordinary temperature and melt upon hating to dissolve the diazo compound, the coupling component, the basic material or the like. Specific examples of these compounds include carboxylic acid amides, N-substituted carboxylic acid amides, ketone compounds, urea compounds and esters.

In the recording material of the present invention, the following known antioxidants, etc. are preferably used for improving the fastness of the thermally developed color images against light and heat, or for decreasing the yellow discoloration of unprinted areas after fixing due to light.

The above-noted antioxidants are described, for example, in EP-A-223739, EP-A-309401, EP-A-309402, EP-A-310551, EP-A-310552, EP-A-459416, German Patent Publication (OLS) No. 3435443, JP-A-54-48535, JP-A-62-262047, JP-A-63-113536, JP-A-63-163351, JP-A-2-262654, JP-A-2-71262, JP-A-3-121449, JP-A-5-61166, JP-A-5-119449, and U.S. Pat. Nos. 4,814,262 and 4,980,275.

Furthermore, various known additives for heat-sensitive recording materials and pressure sensitive recording martials are also effectively used. Specific examples of these additives include the compounds described in JP-A-60-107384, JP-A-60-107383, JP-A-60-125470, JP-A-60-125471, JP-A-60-125472, JP-A-60-287485, JP-A-60-287486, JP-A-60-287487, JP-A-60-287488, JP-A-61-160287, JP-A-61-185483, JP-A-61-211079, JP-A-62-146678, JP-A-62-146680, JP-A-62-146679, JP-A-62-282885, JP-A-63-051174, JP-A-63-89877, JP-A-63-88380, JP-A-63-088381, JP-A-63-203372, JP-A-63-224989, JP-A-63-251282, JP-A-63-267594, JP-A-63-182484, JP-A-01-239282, JP-A-04-291685, JP-A-04-291684, JP-A-05-188687, JP-A-05-188686, JP-A-05-110490, JP-A-05-170361, JP-B-48-043294 (the term "JP-B" as used herein means an "examined Japanese patent publication") and JP-B-48-033212.

Specific examples thereof include 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2,4-trimethyl-1,2,3,4-tetrahydroquinoline, nickel cyclohexanoate, 2,2-bis-4-hydroxyphenylpropane, 1,1-bis-4-hydroxyphenyl-2-ethylhexane, 2-methyl-4-methoxydiphenylamine and 1-methyl-2-phenylindole.

The addition amount of the antioxidants is preferably 0.05 to 100 parts by weight per one part by weight of the diazo compound, and more preferably 0.2 to 30 parts by weight.

The above-described known antioxidants can be contained in the microcapsules together with the diazo compound, or can be used as a solid dispersion together with the coupling agent, the basic material and the other color forming auxiliaries, or as an emulsion together with appropriate emulsifying auxiliaries, or in both of these forms. The antioxidants may be used alone or in combination. Furthermore, the antioxidants may be present or added to the protective layer.

It is not necessary to add antioxidants to the same layer. When used in combination, these antioxidants are classified into structural types such as aniline, alkoxybenzene, hindered phenol, hindered amine, hydroquinone, phosphorus compound and sulfur compound types, and the same or different types or antioxidants may be used in combination.

The coupling component for use in the present invention, as well as the basic material and the other color forming auxiliaries, can be solid dispersed in a sand mill, etc. together with water-soluble polymers. However, it is particularly preferred to use these components as an emulsion formed using appropriate emulsifying auxiliaries.

Preferred examples of the water-soluble polymer include the water-soluble polymers used in preparing the microcapsules (for example, see JP-A-59-190886). In this case, the coupling component, the basic material and the color forming auxiliaries are each added to a solution of the water-soluble polymer to a content of 5 to 40% by weight. The size of the dispersed or emulsified particles is preferably 10 μm or less.

For reducing yellow discoloration of background areas after fixing, free radical generators (compounds which generate free radicals by light irradiation) used in photopolymerizable compositions, etc. can be added to the recording material of the present invention. Such free radical generators include aromatic ketones, quinones, benzoin, benzoin ethers, azo compounds, organic disulfides and acyloxime esters. They are preferably added in an amount of 0.01 to 5 parts by weight per one part by weight of the diazo compound.

Similarly, for reducing yellow discoloration, polymerizable compounds having ethylenic unsaturated bonds (hereinafter referred to as vinyl monomers) can also be used. The term "vinyl monomer" means a compound having at least one ethylenic unsaturated bond (such as a vinyl group, a vinylidene group or the like) in its chemical structure and having a chemical form of a monomer or a prepolymer. Examples thereof include unsaturated carboxylic acids and salts thereof, esters of unsaturated carboxylic acids and polyhydric aliphatic alcohols, and amide compounds of unsaturated carboxylic acids and polyvalent aliphatic amines.

The vinyl monomers are preferably used in an amount of 0.2 to 20 parts by weight per one part by weight of the diazo compound.

The above-described free radical generators and vinyl monomers for use in the present invention can be contained in the microcapsules together with the diazo compounds.

In the present invention, citric acid, tartaric acid, oxalic acid, boric acid, phosphoric acid, pyrophosphoric acid, etc. can be added as acid stabilizers, in addition to the above-mentioned additives.

The recording material of the present invention can be prepared by providing a coating solution containing the diazo compound-containing microcapsules, the coupling component, the organic base and other additives, and by coating a support made of paper or a synthetic resin film with the coating solution by coating methods such as bar coating, blade coating, air knife coating, gravure coating, roll coating, spray coating, dip coating and curtain coating followed by drying, to thereby form a heat-sensitive layer having a solid content of 2.5 $g/m^2$ to 30 $g/m^2$.

In the recording material of the present invention, the microcapsules, the coupling component, the base, etc. may be arranged either in the same layer or in different layers of a lamination type recording material. Furthermore, an intermediate layer can also be provided on the support, followed by forming a heat-sensitive layer thereon, as described in JP-A-61-54980.

The support for use in the present invention include neutral paper with a pH of 5 to 9 sized by a neutral sizing agent such as an alkylketene dimer (as described in JP-A-56-112383), paper satisfying a relationship between the Stöckigt sizing degree and the metric basis weight and having a Beck smoothness of 90 seconds or more as described in JP-A-57-116687, paper having an optical surface roughness of 8 μm or less and a thickness of 30 to 150 μm as described in JP-A-58-136492, paper having a density of 0.9 $g/cm^3$ or less and an optical contact ratio of 15% or more as described in JP-A-58-69091, and paper which resists impregnation with a coating solution and which is made from pulp beaten to a Canadian standard freeness (JIS P8121) of 400 cc or more, as described in JP-A-58-69097, paper having improved developed color density and resolution comprising a glossy coating surface of raw paper made with a Yankee machine as described in JP-A-58-65695, and paper having improved coating properties prepared by subjecting raw paper to a corona discharge treatment as described in JP-A-59-35985, as well as any paper support used in ordinary pressure sensitive or thermal recording paper and dry or wet diazo copying paper.

Furthermore, the synthetic resin film used as a support in the present invention can be selected without particular limitation from known materials which do not deform on heating during the development procedure and have dimensional stability. Such films include films of polyesters such as polyethylene terephthalate and polybutylene terephthalate, films of cellulose derivatives such as cellulose triacetate, and films of polyolefins such as polystyrene, polypropylene and polyethylene. These may be used singly or in a laminated form. The thickness of the support is from 20 μm to 200 μm.

In the present invention, to prevent sticking and head contamination when printing on a heat-sensitive recording layer with a thermal head, or to impart water resistance to the recording material, a protective layer mainly composed of polyvinyl alcohol, etc. and containing various pigments, a surface lubricant, etc. (hereinafter referred to as a protective layer) is preferably further provided on the heat-sensitive recording layer as needed.

When a recording surface of the diazo heat-sensitive recording material thus obtained is heated with a thermal head or the like, the capsule walls of polyurea or polyurethane are softened, and the coupler and the basic compound outside the capsules enter the capsules to develop color. After recording, the diazo compound is decomposed by irradiating with light having a wavelength which is absorbed by the diazo compound. As a result, the diazo compound loses its reactivity with the coupler to thereby fix the images.

The light source for fixing includes various fluorescent lamps, xenon lamps, mercury lamps, etc. It is preferred for efficiently conducting the light fixation that the emission spectra thereof approximately agree with the absorption spectra of the diazo compounds used in the recording materials.

Furthermore, the heat-sensitive recording material of the present invention can also be exposed through an original to decompose the diazo compound present in areas other than the image formation areas, thereby forming latent images, followed by heating to develop the recording material to obtain images.

The diazo heat-sensitive recording material of the present invention can also be used as a multicolor heat-sensitive recording material.

Multicolor heat-sensitive recording materials (light-sensitive heat-sensitive recording materials) are described in JP-A-4-135787, JP-A-4-144784, JP-A-4-144785, JP-A-4-194842, JP-A-4-247447, JP-A-4-247448, JP-A-4-340540, JP-A-4-340541 and JP-A-5-34860. Specifically, such recording materials can be obtained by laminating heat-sensitive recording layers which develop colors which are different in terms of hue from one another. Although there is no particular limitation on the layer constitution, a multicolor heat-sensitive recording material is particularly preferred in which two heat-sensitive recording layers (layers B and C) are laminated with a heat-sensitive recording layer (layer A) comprising an electron donating colorless dye in combination with an electron accepting compound. The layers B and C comprise two kinds of diazonium salt compounds differing in sensitive wavelength, respectively, in combination with couplers. The couplers react with the respective diazonium salt compounds by heating to develop different color hues. That is, a first heat-sensitive recording layer (layer A) comprising the electron donating colorless dye and the electron accepting compound, a second heat-sensitive recording layer (layer B) comprising a diazonium salt compound having a maximum absorption wavelength of 360 nm±20 nm and a coupler which reacts with the diazonium salt compound by heating to develop color, and a third heat-sensitive recording layer (layer C) comprising a diazonium salt compound having a maximum absorption wavelength of 400 nm±20 nm and a coupler which reacts with the diazonium salt compound by heating to develop color are formed on a support in this order. In this case, if the developed colors in the respective heat-sensitive recording layers are selected so as to provide the three primary colors in subtractive color mixing, namely, yellow, magenta and cyan, respectively, it is possible to obtain full color image recording.

When a recording is made on this multicolor heat-sensitive recording material, the third heat-sensitive recording layer (layer C) is first heated to react the diazonium salt with the coupler contained therein, to thereby develop color. Then, the unreacted diazonium salt compound contained in layer C is decomposed by irradiating with light having a wavelength of 400 nm±20 nm. Thereafter, heat sufficient to develop color in the second heat-sensitive recording layer (layer B) is applied to react the diazonium salt with the coupler contained therein, to thereby develop color. At this time, layer C is concurrently strongly heated. However, the diazonium salt compound in layer C has already been decomposed to lose its color forming ability so that color is not developed. Furthermore, the diazonium salt compound contained in layer B is decomposed by irradiating with light having a wavelength of 360 nm±20 nm. Finally, heat sufficient to develop color in the first heat-sensitive recording layer (layer A) is applied to develop color. At this time, heat-sensitive recording layers B and C are concurrently strongly heated. However, the diazonium salt compounds in layers B and C have already been decomposed to lose their color forming ability so that color is not developed. The diazo heat-sensitive recording material of the present invention is preferably used in the form of a multicolor heat-sensitive recording material as described above.

In the heat-sensitive recording material of the present invention, the 4-substituted amino-2-alkoxybenzenediazonium salts are used as color formers, so that red-colored images of high quality can be obtained. Furthermore, the specific combination of the diazonium salt and the coupler of the present invention improves the light fastness of the recorded images.

The present invention will be described in greater detail with reference to the following Examples, which are, however, not to be construed as limiting the invention.

EXAMPLE 1

Preparation of Capsule Solution A of The Invention

To 19 parts of ethyl acetate, 2.8 parts of (A-4) of this invention and 10 parts of tricresyl phosphate were added and homogeneously mixed therewith. Then, 7.6 parts of Takenate D-110N (manufactured by Takeda Chemical Industries Co., Ltd.) was added as a wall forming material to the resulting mixed solution and homogeneously mixed therewith to obtain solution I.

Then, 46.1 parts of an 8-wt. % aqueous solution of phthalated gelatin, 17.5 parts of water, and 2 parts of a 10% aqueous solution of sodium dodecylbenzenesulfonate were added to this solution I, followed by emulsifying and dispersing at 40° C. and 10000 r.p.m. for 10 minutes. To the resulting emulsified product, 20 parts of water was added and homogenized. Thereafter, the encapsulation reaction was conducted with stirring at 40° C. for 3 hours to obtain capsule solution A. The particle size of the capsules thus prepared was 0.35 μm.

Preparation of Coupling Component/Base Emulsion B

In 10.5 parts of ethyl acetate, 3.0 parts of compound (B-1) described in this specification as a specific example, 4.0 parts of 1,1-(p-hydroxyphenyl)-2-ethylhexane, 8.0 parts of 4,4'-(p-phenylenediisopropylidene)diphenol, 4.0 parts of triphenylguanidine, 0.64 part of tricresyl phosphate and 0.32 part of diethyl maleate were dissolved to obtain solution II.

Then, 49.1 parts of a 15-wt. % aqueous solution of lime-treated gelatin, 9 parts of a 10% aqueous solution of sodium dodecylbenzenesulfonate and 35 parts of water were homogeneously mixed at 40° C., and solution II was added thereto, followed by emulsifying and dispersing with a homogenizer at 40° C. and 10000 r.p.m. for 10 minutes. The resulting emulsified product was stirred at 40° C. for 2 hours to remove ethyl acetate, and thereafter, the weight of evaporated ethyl acetate and water was supplemented by adding water to obtain coupling component/base emulsion B.

Preparation of Coating Solution C

After homogeneous mixing of 6 parts of capsule solution A, 4.4 parts of water and 1.9 parts of a 15-wt. % aqueous solution of lime-treated gelatin at 40° C., 8.3 parts of coupling component/base emulsion B was added to the resulting solution and homogeneously mixed therewith to obtain coating solution C for a heat-sensitive recording layer.

Preparation of Coating Solution D for a Protective Layer

Thirty-two parts of a 10% aqueous solution of polyvinyl alcohol (polymerization degree: 1,700, saponification degree: 88%) and 36 parts of water were homogeneously mixed to obtain coating solution D for a protective layer.

Coating

A support for photographic printing paper comprising woodfree paper laminated with polyethylene was coated with solution C for a heat-sensitive recording layer and coating solution D for a protective layer with a wire bar and dried at 50° C. in this order to obtain a desired diazo heat-sensitive recording material. The coated amounts were 6.4 $g/m^2$ and 1.05 $g/m^2$ in terms of solid content, respectively.

Test of Color Development and Fixing

Using a thermal head (Type KST, manufactured by Kyocera Corp.), the electric power to the thermal head and the pulse width were selected so as to apply a recording energy per unit area of 0 to 40 $mJ/mm^2$, and thermal printing was carried out on the diazo heat-sensitive recording layer to obtain an image. Then, the entire surface was irradiated to light for 15 seconds using an ultraviolet lamp having an emission center wavelength of 365 nm and an output of 40 W. The density of the image area and the background area of the resulting sample was measured with a Macbeth densitometer.

Light Fastness Test

The above-described color developed and fixed sample was further subjected to continuous light irradiation for 72 hours with a fluorescent lamp light fastness tester at 32000 luxes. Discoloration of the image areas and the background areas were then determined. For image density, changes in density in which the initial reflection density was about 1.1 were measured with a Macbeth densitometer.

Comparison Test of Raw Stock Storability

A test of raw stock storability was carried out by measuring the difference between the developed color density and the background density after heating with a heat plate, for a diazo heat-sensitive recording sheet stored at room temperature and one forcedly stored under conditions of 60° C. and 30% RH for 72 hours. The changes in developed color density were measured with a Macbeth reflection densitometer.

EXAMPLES 2 TO 5

The same procedures as in Example 1 were followed, except that diazonium compound (A-4) used in capsule solution A in Example 1 was replaced with (A-5), (A-6), (A-7) and (A-8) of the invention, respectively, to obtain capsule solutions.

Comparative Example 1

The same procedure as in Example 1 was followed, except that the coupling component used in Example 1 was replaced with 1-[(n-octadecyl)oxypropyl]-3-phenyl-2,4,6-(1H,3H,5H)-pyrimidinetrione to obtain a coupling component/base emulsion.

Comparative Examples 2 and 3

The same procedures as in Example 1 were followed, except that the diazonium salt compound used in Example 1 was replaced with 2-(n-hexyl)oxy-4-{N-[1-methyl-2-(4-methoxyphenoxy)]ethyl,N-n-hexyl}aminobenzenediazonium hexafluorophosphate and 2-(n-hexyl)oxy-4-[N-1-methyl-2-phenoxy)ethyl,N-n-hexyl]aminobenzenediazonium hexafluorophosphate, respectively, to obtain capsule solutions.

The results obtained in the comparison test of the raw stock storability in terms of developed color densities and background densities are shown in Table 1 below.

TABLE 1

| | Developed Color Hue λmax | Developed Color Density (Image Area) Before Forced Storage | After Forced Storage | Developed Color Density (Background Area) Before Forced Storage | After Forced Storage |
|---|---|---|---|---|---|
| Example 1 | 530 nm | 1.10 | 1.02 | 0.10 | 0.10 |
| Example 2 | 535 nm | 1.10 | 1.03 | 0.10 | 0.10 |
| Example 3 | 530 nm | 1.10 | 1.01 | 0.10 | 0.11 |
| Example 4 | 525 nm | 1.10 | 1.02 | 0.10 | 0.10 |
| Example 5 | 530 nm | 1.10 | 1.01 | 0.10 | 0.10 |
| Comparative Example 1 | 485 nm | 1.10 | 0.97 | 0.11 | 0.12 |
| Comparative Example 2 | 545 nm | 1.10 | 0.95 | 0.14 | 0.22 |
| Comparative Example 3 | 545 nm | 1.10 | 0.96 | 0.21 | 0.31 |

The image storage characteristics (light fastness) of the color-developed areas are shown in Table 2 below.

TABLE 2

| | Developed Color Density (Image Area) | | Developed Color Density (Background Area) | |
|---|---|---|---|---|
| | Before Light Irradiation | After Light Irradiation | Before Light Irradiation | After Light Irradiation |
| Example 1 | 1.10 | 1.04 | 0.10 | 0.10 |
| Example 2 | 1.10 | 1.03 | 0.10 | 0.10 |
| Example 3 | 1.10 | 1.02 | 0.10 | 0.11 |
| Example 4 | 1.10 | 1.02 | 0.10 | 0.11 |
| Example 5 | 1.10 | 1.04 | 0.10 | 0.11 |
| Comparative Example 1 | 1.10 | 1.03 | 0.21 | 0.24 |
| Comparative Example 2 | 1.10 | 0.83 | 0.17 | 0.22 |
| Comparative Example 3 | 1.10 | 0.85 | 0.24 | 0.29 |

EXAMPLE 6

A coupler/base emulsion was obtained in the same manner as in Example 1, except that compound (B-1) used in Example 1 was replaced with compound (B-2). Then, a recording material was prepared, and an image was formed in the same manner as in Example 1. The densities of the color-developed area and the background area were measured with a Macbeth densitometer.

EXAMPLE 7

A coupler/base emulsion was obtained in the same manner as in Example 1, except that compound (B-1) used in Example 1 was replaced with compound (B-4). Then, a recording material was prepared, and an image was formed in the same manner as in Example 1. The densities of the color-developed area and the background area were measured with a Macbeth densitometer.

EXAMPLE 8

A coupler/base emulsion was obtained in the same manner as in Example 1, except that compound (B-1) used in Example 1 was substituted with compound (B-6). Then, a recording material was prepared, and an image was formed in the same manner as in Example 1. The densities of the color-developed area and the background area were measured with a Macbeth densitometer.

EXAMPLE 9

A coupler/base emulsion was obtained in the same manner as in Example 1, except that compound (B-1) used in Example 1 was replaced with compound (B-8). Then, a recording material was prepared, and an image was formed in the same manner as in Example 1. The densities of the color-developed area and the background area were measured with a Macbeth densitometer.

EXAMPLE 10

A coupler/base emulsion was obtained in the same manner as in Example 1, except that compound (B-1) used in Example 1 was replaced with compound (B-10). Then, a recording material was prepared, and an image was formed in the same manner as in Example 1. The densities of the color-developed area and the background area were measured with a Macbeth densitometer.

Comparative Example 4

A coupler/base emulsion was obtained in the same manner as in Example 1, except that compound (B-1) used in Example 1 was replaced with 5-(2-tetradecyloxyphenyl) cyclohexane-1,3-dione. Then, a recording material was prepared, and an image was formed in the same manner as in Example 1. The densities of the color-developed area and the background area were measured with a Macbeth densitometer.

Comparative Example 5

A coupler/base emulsion was obtained in the same manner as in Example 1, except that compound (B-1) used in Example 1 was replaced with 1-phenyl-3-octyloxycarbonyl-pyrazoli-5-one. Then, a recording material was prepared, and an image was formed in the same manner as in Example 1. The densities of the color-developed area and the background area were measured with a Macbeth densitometer.

Comparative Example 6

A coupler/base emulsion was obtained in the same manner as in Example 1, except that compound (B-1) used in Example 1 was replaced with N-(2',5'-dibutyloxy-4'-chlorophenyl)-4,4-dimethyl-3-oxopentaamide. Then, a recording material was prepared, and an image was formed in the same manner as in Example 1. The densities of the color-developed area and the background area were measured with a Macbeth densitometer.

The samples thus prepared were evaluated with respect to raw stock storability, the results of which are set forth in Table 3 below.

TABLE 3

| | Developed Color Hue λmax | Developed Color Density (Image Area) | | Developed Color Density (Background Area) | |
|---|---|---|---|---|---|
| | | Before Forced Storage | After Forced Storage | Before Forced Storage | After Forced Storage |
| Example 6 | 530 nm | 1.10 | 1.04 | 0.10 | 0.11 |
| Example 7 | 535 nm | 1.10 | 1.03 | 0.10 | 0.11 |
| Example 8 | 536 nm | 1.10 | 1.04 | 0.10 | 0.11 |
| Example 9 | 535 nm | 1.10 | 1.03 | 0.10 | 0.11 |
| Example 10 | 533 nm | 1.10 | 1.03 | 0.10 | 0.11 |
| Comparative Example 4 | 480 nm | 1.10 | 0.97 | 0.10 | 0.12 |
| Comparative Example 5 | 550 nm | 1.10 | 1.03 | 0.20 | 0.23 |
| Comparative Example 6 | 445 nm | 1.10 | 1.04 | 0.10 | 0.13 |

The samples thus prepared were also evaluated with respect to image storage characteristics (light fastness) of the color-developed areas, the results of which are set forth in Table 4 below.

TABLE 4

| | Developed Color Density (Image Area) | | Developed Color Density (Background Area) | |
|---|---|---|---|---|
| | Before Light Irradiation | After Light Irradiation | Before Light Irradiation | After Light Irradiation |
| Example 6 | 1.10 | 1.05 | 0.10 | 0.11 |
| Example 7 | 1.10 | 1.06 | 0.10 | 0.11 |
| Example 8 | 1.10 | 1.08 | 0.10 | 0.12 |
| Example 9 | 1.10 | 1.05 | 0.10 | 0.12 |
| Example 10 | 1.10 | 1.06 | 0.10 | 0.11 |
| Comparative | 1.10 | 0.51 | 0.10 | 0.15 |

TABLE 4-continued

| | Developed Color Density (Image Area) | | Developed Color Density (Background Area) | |
|---|---|---|---|---|
| | Before Light Irradiation | After Light Irradiation | Before Light Irradiation | After Light Irradiation |
| Example 4 | | | | |
| Comparative Example 5 | 1.10 | 0.94 | 0.20 | 0.41 |
| Comparative Example 6 | 1.10 | 0.85 | 0.10 | 0.12 |

The above results demonstrate that the diazo heat-sensitive recording material of the present invention comprising a specific diazo compound and a specific coupling component exhibits excellent raw stock storability such that the reduction in developed color density is small and the background whiteness remains high. Furthermore, the above results demonstrate that the recording material of the present invention provides excellent image storage characteristics (light fastness) of the color-developed areas.

While the invention has been described in detail and with reference to specific examples thereof, it will be apparent to one skilled in the art that various changes and modifications can be made therein without departing from the spirit and scope thereof.

What is claimed is:

1. A diazo heat-sensitive recording material comprising a support having thereon a recording layer comprising a diazo compound, a coupling component and an organic base, wherein said diazo compound is a diazonium salt represented by the following general formula (I) and said coupling component is a compound represented by the following general formula (II):

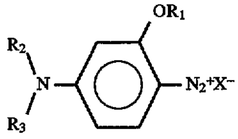

(I)

wherein $R_1$, $R_2$ and $R_3$ each represents an alkyl group, an aralkyl group or an aryl group; $R_2$ and $R_3$ may form a ring together with the nitrogen atom in formula (I) adjacent to $R_2$ and $R_3$; and X represents an acid anion,

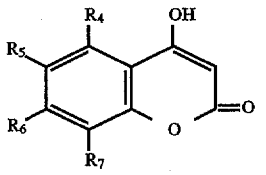

(II)

wherein $R_4$, $R_5$, $R_6$ and $R_7$, which may be the same or different, each represents a hydrogen atom, an alkyl group, an aryl group, an aralkyl group, an alkyloxy group, an aryloxy group, an alkylthio group, an arylthio group, an acyl group, an alkoxycarbonyl group, an acyloxy group, a carbamoyl group, a sulfamoyl group, a halogen atom, a cyano group or a nitro group; and $R_4$ and $R_5$, $R_5$ and $R_6$, or $R_6$ and $R_7$ may be combined with each other to form a ring.

2. The diazo heat-sensitive recording material as claimed in claim 1, wherein said recording layer further comprises microcapsules, and said diazo compound is encapsulated in said microcapsules.

3. The diazo heat-sensitive recording material as claimed in claim 1, wherein the total number of carbon atoms in $R_1$, $R_2$ and $R_3$ of formula (I) is 12 or more.

4. The diazo heat-sensitive recording material as claimed in claim 1, wherein the alkyl, aralkyl, or aryl groups represented by $R_1$, $R_2$ and $R_3$ are substituted or unsubstituted.

5. The diazo heat-sensitive recording material as claimed in claim 1, wherein said diazonium salt represented by formula (I) is represented by the following general formula (III):

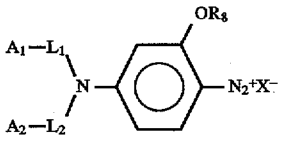

(III)

wherein $R_8$ represents an alkyl group, an aralkyl group or an aryl group; $L_1$ and $L_2$ each represents an alkylene group; $A_1$ and $A_2$ each represents an alkyl group, an aralkyl group, an aryl group, an alkyloxy group, an aryloxy group, an alkylthio group, an arylthio group, an acyl group, an alkoxycarbonyl group, an acyloxy group, a carbamoyl group, an alkylsulfonyl group, an arylsulfonyl group, a sulfamoyl group, a halogen atom or a cyano group; $L_1$ and $L_2$, and $A_1$ and $A_2$ may each be the same or different; and X represents an acid anion.

6. The diazo heat-sensitive recording material as claimed in claim 5, wherein at least one of $A_1$ and $A_2$ is an alkoxycarbonyl group, a carbamoyl group, a sulfamoyl group or a cyano group.

7. The diazo heat-sensitive recording material as claimed in claim 1, wherein the total number of carbon atoms in $R_4$, $R_5$, $R_6$ and $R_7$ in formula (II) is 12 or more.

8. The diazo heat-sensitive recording material as claimed in claim 1, wherein the compound represented by formula (II) is represented by general formula (IV):

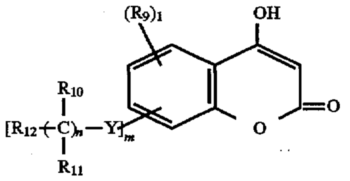

(IV)

wherein $R_9$ represents a hydrogen atom, an alkyl group, an aryl group, an aralkyl group, an acyl group, an alkoxycarbonyl group, an acyloxy group, a carbamoyl group, a sulfamoyl group or a halogen atom; $R_{10}$, $R_{11}$ and $R_{12}$ each represents a hydrogen atom, an alkyl group, an aryl group, an aralkyl group, an alkyloxy group, an aryloxy group, an alkylthio group, an arylthio group, an acyl group, an alkoxycarbonyl group, an acyloxy group, a carbamoyl group or a sulfamoyl group; Y represents an oxygen atom or a sulfur atom; and l+m is an integer of 1 to 4 with the proviso that m is an integer of 1 or more and n represents an integer of 1 to 10.

9. The diazo heat-sensitive recording material as claimed in claim 1, wherein the diazo compound has a melting point of from 30° to 200° C.

10. The diazo heat-sensitive recording material as claimed in claim 1, wherein said recording layer contains the diazo compound in an amount of from 0.02 $g/m^2$ to 3 $g/m^2$.

11. The diazo heat-sensitive recording material as claimed in claim 1, wherein said recording layer contains the compound represented by formula (II) in an amount of from 0.1 to 30 parts by weight per one part by weight of the diazo compound.

12. The diazo heat-sensitive recording material as claimed in claim 2, wherein said recording layer further comprises an organic base, and said compound represented by formula (II) and said organic base are arranged outside the microcapsules.

13. The diazo heat-sensitive recording material as claimed in claim 1 comprising at least two recording layers, wherein each of said recording layers contains a diazonium salt represented by formula (I) having a maximum absorption wavelength different from that of the diazonium salt contained in the other recording layers.

* * * * *